US009508586B2

United States Patent
Huang et al.

(10) Patent No.: US 9,508,586 B2
(45) Date of Patent: Nov. 29, 2016

(54) DEBONDING SCHEMES

(71) Applicant: Taiwan Semiconductor Manufacturing Company, Ltd., Hsin-Chu (TW)

(72) Inventors: Xin-Hua Huang, Xihu Township (TW); Ping-Yin Liu, Yonghe (TW); Hung-Hua Lin, Taipei (TW); Lan-Lin Chao, Sindian (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/517,569

(22) Filed: Oct. 17, 2014

(65) Prior Publication Data

US 2016/0111316 A1  Apr. 21, 2016

(51) Int. Cl.
*H01L 21/68* (2006.01)
*H01L 21/683* (2006.01)
*H01L 23/00* (2006.01)

(52) U.S. Cl.
CPC ......... *H01L 21/6838* (2013.01); *H01L 24/799* (2013.01); *H01L 24/98* (2013.01); *H01L 2924/35* (2013.01)

(58) Field of Classification Search
CPC . H01L 21/6838; H01L 24/799; H01L 24/98; H01L 2924/35; H01L 21/6835; H01L 2221/68327; H01L 2221/68381; H01L 2221/68318; H01L 21/2007; H01L 21/02; H01L 2924/00; H01L 2224/32145; B32B 43/006; B32B 2457/14
USPC .................................. 438/458, 14
See application file for complete search history.

(56) References Cited

U.S. PATENT DOCUMENTS

| | | | | |
|---|---|---|---|---|
| 5,783,022 A | * | 7/1998 | Cha | B26D 3/28 134/137 |
| 7,622,048 B2 | | 11/2009 | Birkmeyer et al. | |
| 2005/0009297 A1 | * | 1/2005 | Rayssac | B28D 5/0011 438/455 |
| 2005/0150597 A1 | * | 7/2005 | Henley | B28D 5/00 156/755 |
| 2014/0076497 A1 | | 3/2014 | Honda et al. | |

FOREIGN PATENT DOCUMENTS

| | | |
|---|---|---|
| JP | 2008306120 A | 12/2008 |
| KR | 1020070073919 A | 7/2007 |
| KR | 1020140037756 A | 3/2014 |

* cited by examiner

*Primary Examiner* — Caleen Sullivan
(74) *Attorney, Agent, or Firm* — Slater Matsil, LLP

(57) ABSTRACT

A method includes receiving a wafer stack having at least two wafers bonded together. At least one blade is inserted between a first wafer of the at least two wafers and a second wafer of the at least two wafers. The blade has a channel configured to inject air or fluid. The first wafer is debonded from the second wafer using the at least one blade. In another embodiment, a detacher having a convex bottom surface is attached to the wafer stack. The first wafer is debonded from the second wafer using the detacher.

20 Claims, 11 Drawing Sheets

DEBONDING SCHEMES

BACKGROUND

In the manufacturing of integrated circuits, wafers are used for forming integrated circuits. In some applications, wafers are bonded together to form a wafer stack. During inspection of the bonded wafers, the bonding may be found defective and the wafers may need to be debonded from each other. If the bonding of the wafer stack is successful, some remaining processes may be performed on the wafers to complete the manufacturing process.

However, some wafer stacks are difficult to separate by using conventional mechanical or chemical methods. Also, the wafers are sometimes relatively thin to endure the force applied in such debonding processes. Such wafers may suffer breakage during debonding processes. Accordingly, methods of debonding wafers are desired to prevent wafer breakage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
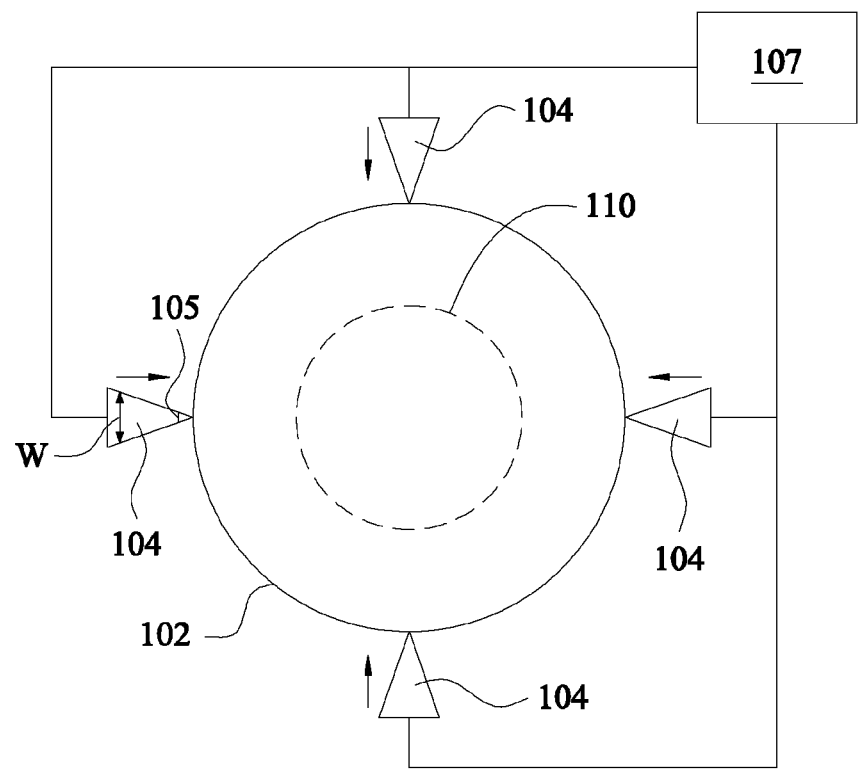
FIG. 1A is a top view of a debonding scheme of a wafer stack according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some fabrication processes, wafers are bonded together to form a wafer stack. During the inspection of the bonded wafers, the bonding may be found defective and the wafers may need to be debonded from each other. However, some wafer stacks are difficult to separate by using conventional mechanical or chemical methods. Also, the wafers are sometimes relatively thin to endure the force applied in such debonding processes. Such wafers may suffer breakage during debonding processes. Debonding schemes to separate wafers that help to reduce wafer damage during a debonding process are disclosed herein.

Figure 1B:
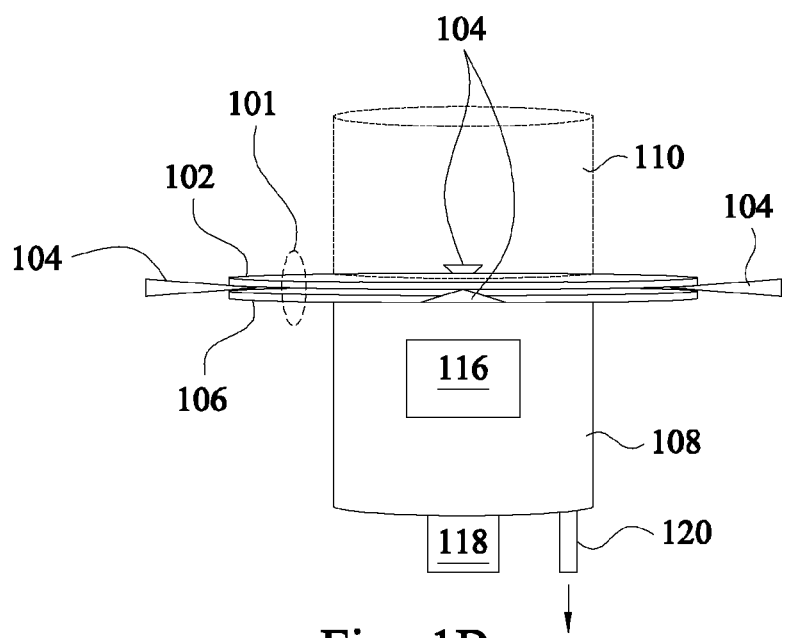
FIG. 1B is a perspective diagram of the debonding scheme in FIG. 1A according to some embodiments.

FIG. 1A is a top view of a debonding scheme of a wafer stack according to some embodiments. FIG. 1B is a perspective diagram of the debonding scheme in FIG. 1A according to some embodiments. In the description below, both figures are referred to for reference.

In FIG. 1A, a top view of a wafer stack (101 in FIG. 1B) including a top wafer 102 and a bottom wafer (106 in FIG. 1B) is shown, as more clearly illustrated in FIG. 1B. The top and bottom wafers 102 and 106 comprise silicon, silicon dioxide, aluminum oxide, sapphire, germanium, gallium arsenide (GaAs), an alloy of silicon and germanium, indium phosphide (InP), silicon on insulator (SOI), or any other suitable material in some embodiments. The wafers 102 and 106 may also be made of or include some other suitable elementary semiconductor, such as diamond or germanium; a suitable compound semiconductor, such as silicon carbide, indium arsenide; or a suitable alloy semiconductor, such as silicon germanium carbide, gallium arsenic phosphide, or gallium indium phosphide. Alternatively, the wafers 102 and 106 may include a non-semiconductor material such as a glass wafer for thin-film-transistor liquid crystal display (TFT-LCD) devices, or fused quartz or calcium fluoride for a photomask (mask).

In some embodiments, the wafer 102 and/or 106 include one or more material layers (e.g., insulating, conductive, semi-conductive, etc.) formed thereon. The wafer 102 and/or 106 may include various doped regions, dielectric features, and multilevel interconnects. The wafer 102 and/or 106 may further include additional features or layers with various devices and functional features. Active and passive devices, such as transistors, capacitors, resistors, and the like, may be formed on the wafer 102 and/or 106. In some embodiments, the wafer 102 and/or 106 includes various doped features for various microelectronic components, such as a complementary metal-oxide-semiconductor field-effect transistor (CMOSFET), an imaging sensor, and a memory cell. As used herein, the term "wafer" includes the various layers, regions, and features described herein.

The top wafer 102 and the bottom wafer 106 are bonded together. In some applications, a fusion bonding is used, which is also referred to as direct bonding. A direct bonding is a wafer bonding process without any additional intermediate layers, such as adhesives. The bonding process is based on chemical bonds between two surfaces of wafers, e.g., Si—Si, oxide-oxide, etc. Some requirements may be specified for the wafer surface, such as sufficiently clean, flat, and smooth conditions. Otherwise unbonded areas (also called voids, i.e. interface bubbles) can occur.

The procedural steps of the direct bonding process of wafers may include wafer surface preprocessing, pre-bonding at room temperature, and annealing at elevated temperatures. Direct bonding as a wafer bonding technique is able to process many materials, and silicon and oxide are often used materials. For example, applications for silicon direct bonding include manufacturing of Silicon on insulator (SOI) wafers, sensors, micro-electromechanical system (MEMS), and actuators, etc.

Another wafer bonding process is anodic bonding. Anodic bonding is commonly used to seal glass to thin pieces of silicon in integrated circuit fabrication. This bonding technique is also known as field assisted bonding or electrostatic sealing, and is mostly used for connecting silicon/glass and metal/glass through electric fields. The requirements for anodic bonding may include clean and even wafer surfaces and atomic contact between the bonding wafers through a sufficiently powerful electrostatic field. In some applications, the coefficients of thermal expansion (CTE) of the bonded wafers are similar. In some applications, other materials are used for anodic bonding with silicon, i.e., low-temperature cofired ceramics (LTCC). Exemplary applications for anodic bonding include manufacturing of micro-electromechanical system (MEMS), micro-Total Analysis Systems (μTAS), microfluidic devices, and miniaturized biological reactors, etc.

Yet another wafer bonding process is eutectic bonding. Eutectic bonding is a wafer bonding technique with an intermediate metal layer that can produce a eutectic system. For example, eutectic bonding is used in solder ball bonding. Those eutectic metals are alloys that transform directly from solid to liquid state, or vice versa from liquid to solid state, at a specific composition and temperature without passing a two-phase equilibrium, i.e. liquid and solid state. The fact that the eutectic temperature can be lower than the melting temperature of the two or more pure elements can be important in eutectic bonding.

Eutectic alloys are deposited by sputtering, dual source evaporation, or electroplating. It also can be formed by diffusion reactions of pure materials and subsequently melting of the eutectic composition. The eutectic bonding can be conducted at relatively low processing temperatures, and provides low resultant stress induced in final assembly, high bonding strength, large fabrication yield and a good reliability. Those attributes are dependent on the coefficient of thermal expansion (CTE) between the wafers. Exemplary applications for eutectic bonding include manufacturing of pressure sensors or fluidics, micro-electromechanical system (MEMS), etc.

Four blades 104 are shown in FIGS. 1A and 1B, while performing a debonding operation of being inserted between the top wafer 102 and the bottom wafer 106. The blades 104 have a width W ranging from 1 mm to 5 mm, e.g., 2 mm, in some embodiments. The blades 104 have a horizontal tip angle 105 in the range of about 10°-about 15° in some embodiments.

In some embodiments, the wafers 102 and 106 may have beveled edges at some locations or all around the circumferences of the wafers 102 and 106. The blades 104 can be inserted in areas between the top wafer 102 and the bottom wafer 106, and the areas may have beveled edges to help the insertion as shown in FIG. 1E. The insertion point can be precisely controlled with a resolution R down to about 50 nm to about 150 nm, e.g., using a motor and/or an optical instrument, in some embodiments.

The blades 104 can be driven (moved) toward the center of the wafer stack 101, and are controlled by a control circuit 107 in some embodiments. (The control circuit 107 is not shown in other figures for simplicity.) The blades 104 are fixed on any suitable fixtures that can be moved towards the center of the wafer stack 101 in some embodiments. Such fixtures are connected with motors (not shown) that can move the fixtures and the blades 104 in some embodiments. The force from the insertion point can be detected for a feedback by the impedance current of the motors connected to the fixtures in some embodiments.

The four blades 104 are arranged at four locations around the circumference of the wafer stack 101. In some embodiments, the four locations are separated from each other by an equal distance. The four locations are arranged at 90 degrees apart around the center of the wafer stack 102 in some examples. Even though four blades 104 are shown in FIGS. 1A and 1B, any number of blades can be used, such as one, two, three, or more as shown in FIGS. 2C-2E. The blades 104 are described in more detail with respect to FIGS. 1C and 1D in some embodiments.

The wafer stack 101 is mounted on a bottom stage 108 as shown in FIG. 1B in some embodiments. The bottom stage 108 is a vacuum stage providing vacuum suction on the bottom surface of the bottom wafer 106 to help stabilize and hold the bottom wafer 106 of the wafer stack 101 during the debonding process in some embodiments. There is a vacuum module 120 connected to the bottom stage 108 in some embodiments. The bottom stage 108 has a heating element 116 to help the debonding process in some embodiments. For example, if the wafer stack 101 is bonded using eutectic bonding, the temperature of the heating element 116 could be over 300° C.

A top stage 110 shown in dotted line in FIGS. 1A and 1B is used to hold the top wafer 102 in some embodiments. The top stage 110 is a vacuum stage providing vacuum suction on the top surface of the top wafer 102 to help stabilize and hold the top wafer 102 of the wafer stack 101 during the debonding process in some embodiments. The top stage 110 and the bottom stage 108 can be moved upward and downward respectively during a debonding process to help the separation of the top wafer 102 and the bottom wafer 106 in some embodiments. For example, a motor 118 connected to the bottom stage 108 can be used to move the bottom stage 108. A similar arrangement for movement can be made for the top stage 110.

The top stage 110 and the bottom stage 108 have a diameter (or surface length) ranging from 310 mm to 350 mm in some embodiments to hold or cover various wafer sizes. The top stage 110 and the bottom stage 108 can be made of SiN, stainless steel, aluminum, any combination thereof, or any other suitable material. The vacuum suction force of the top stage 110 and the bottom stage 108 may range from −800 mbar to −1600 mbar in some embodiments. In other embodiments, the size, material, and vacuum pressure range of the top stage 110 and the bottom stage 108 can be different.

Figure 1C:
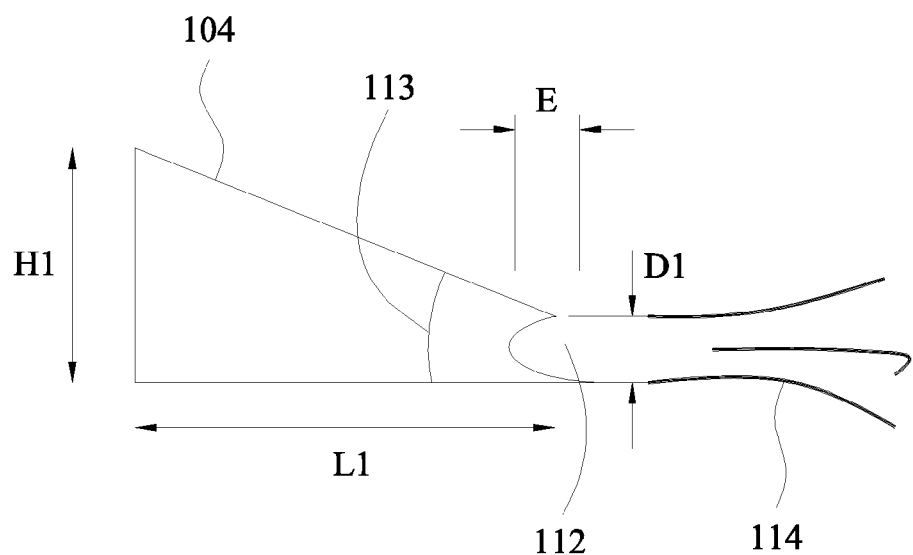
FIG. 1C is a cross section of the blade used in the debonding scheme in FIG. 1A according to some embodiments.

FIG. 1C is a cross section of the blade 104 used in the debonding scheme of wafer stack in FIG. 1A according to some embodiments. The blade 104 has a channel 112 that can be used to inject or send out air/liquid to help the debonding process. The blade 104 has a height H1 ranging from 0.1 mm to 2 cm, a length L1 ranging from 1 mm to 5 cm, a channel 112 diameter D1 ranging from 0.01 mm to 1 mm, and a tip length E ranging from 0 mm to 0.5 mm in some embodiments. The tip length E provides space for air/liquid flow. The blade 104 has a vertical tip angle 113 in the range of 1°-3° in some embodiments. In one example, the blade 104 has the height H1 of 0.5 mm, the length L1 of 10 mm, the channel 112 diameter D1 of 0.1 mm, and a tip length E of 0.3 mm.

In order not to damage the wafers 102 and 106, the blade 104 is made of Teflon, glass, ceramic, any combination thereof, or any other suitable material. If the blade 104 is too hard, the wafers 102 and 106 may be damaged. If the blade 104 is too soft, the blade 104 may have difficulty when inserting between the wafers 102 and 106. In some embodiments, the blades 104 have a hardness range from 60 to 70 in durometer type A. The blade 104 can inject or send out air/liquid flow 114 to assist the debonding process in some embodiments. For example, the air/liquid flow 114 rate can be up to 1 c.c. per minute or more in some embodiments. The liquid sent out by the blade 104 can be deionized (DI) water in some embodiments. The temperature of air or liquid can be at a room temperature. In some embodiments, the temperature of air or liquid is about 22° C.-23° C.

Figure 1D:
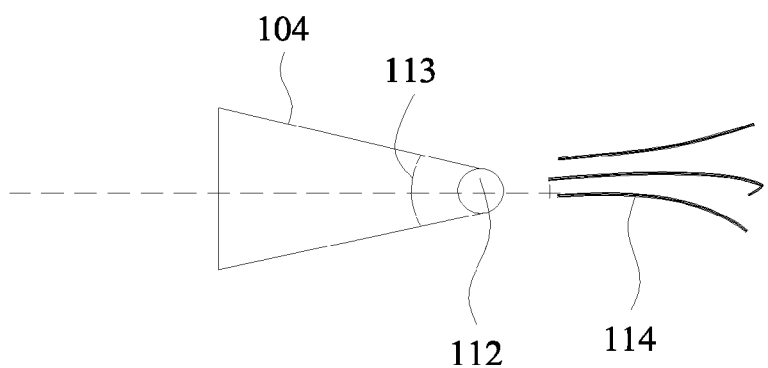
FIG. 1D is another cross section of the blade used in the debonding scheme in FIG. 1A according to some embodiments.
Figure 1E:
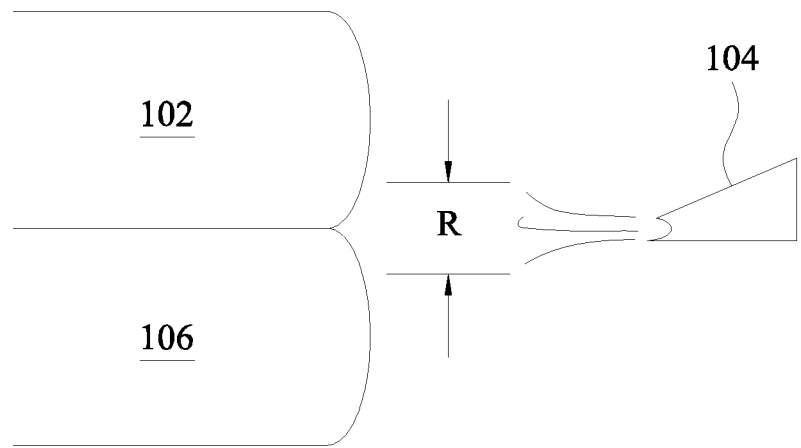
FIG. 1E is a side view of the wafer stack edge during the debonding scheme in FIG. 1A according to some embodiments.

FIG. 1D is another cross section of the blade 104 used in the debonding scheme of wafer stack in FIG. 1A according to some embodiments. The blade 104 in FIG. 1D has symmetric angled slopes on both upward and downward directions with respect to the horizontal line (dotted line). The blade 104 has a vertical tip angle 113 in the range of 1°-3° in some embodiments. The dimensions and material of the blade 104 in FIG. 1D, including the channel 112, are similar to the blade 104 in FIG. 1C. The air/liquid flow 114 that can be sent through the channel 112 is also similar as described above with respect to FIG. 1C.

Figure 1F:
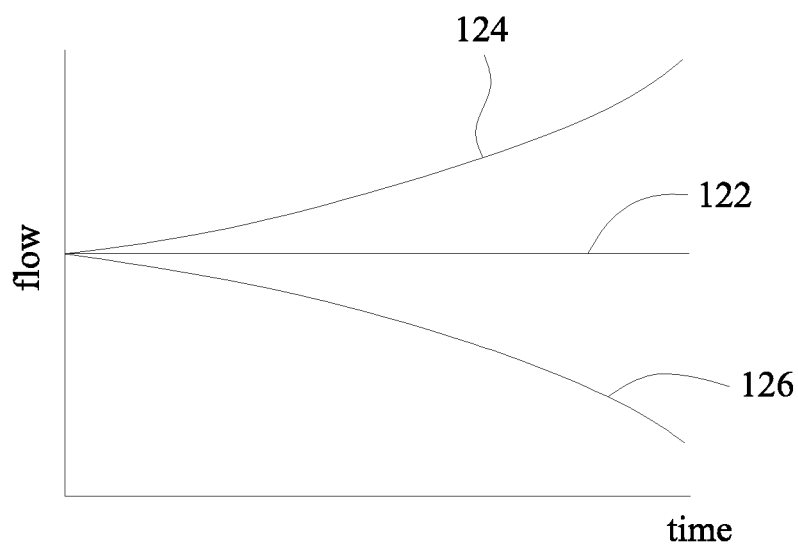
FIG. 1F is a plot of air/liquid flow rate vs. time from the blade in FIGS. 1C and 1D according to some embodiments.

FIG. 1F is a plot of air/liquid flow rate vs. time from the blade in FIGS. 1C and 1D according to some embodiments. As shown, the air/liquid flow rate can be constant 112, increased 124, or decreased 126 over time in some embodiments. The air/liquid flow rate can change depending on various applications.

Figure 2A:
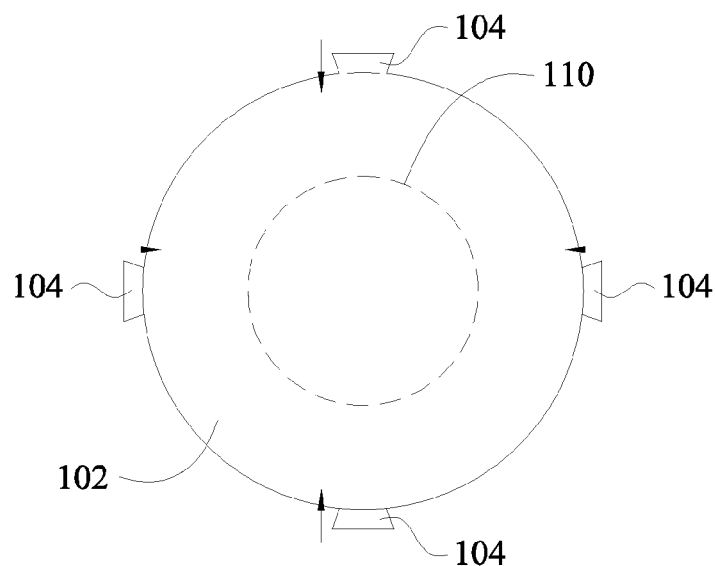
FIG. 2A is another top view of the debonding scheme in FIG. 1A at a later stage according to some embodiments.
Figure 2B:
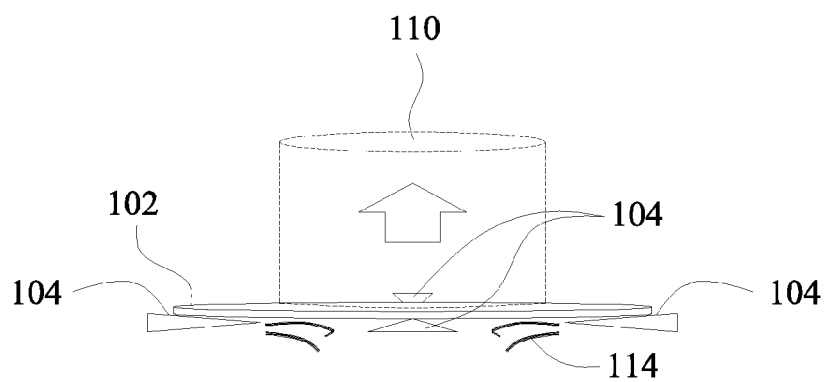
FIG. 2B is a perspective diagram of the debonding scheme in FIG. 2A according to some embodiments.
Figure 2B:
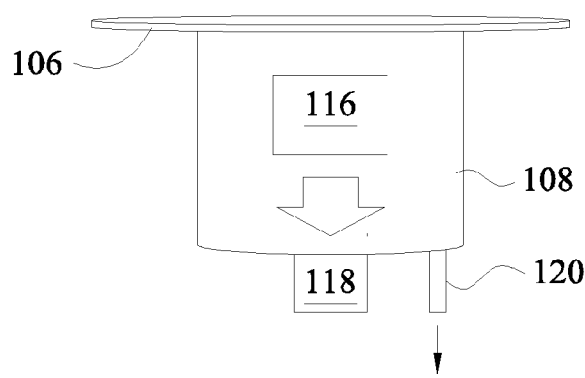
Figure 2C:
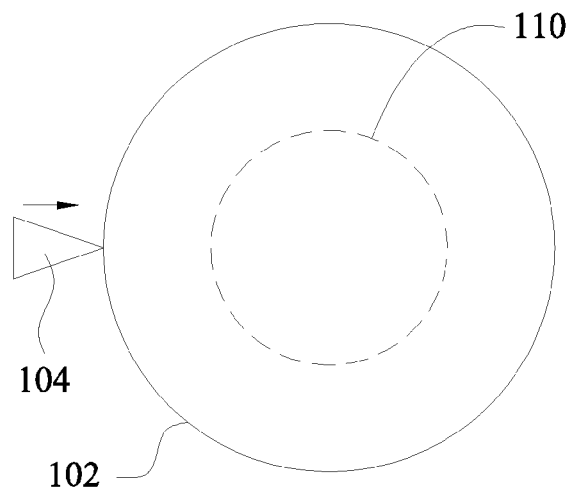
FIGS. 2C-2E are top views of the debonding scheme according to some other embodiments.
Figure 2D:
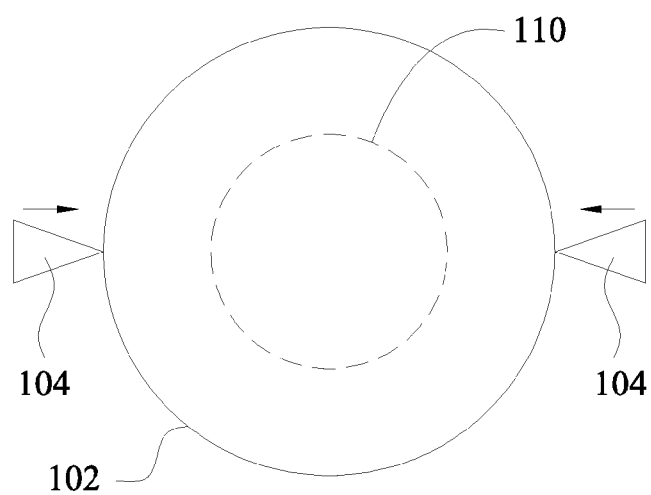
Figure 2E:
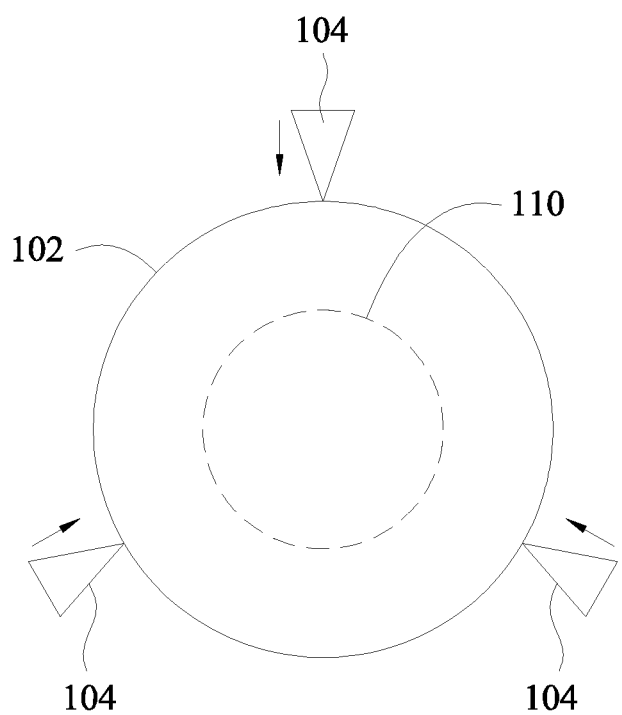

FIG. 2A is another top view of the debonding scheme in FIG. 1A at a later stage according to some embodiments. FIG. 2B is a perspective diagram of the debonding scheme in FIG. 2A according to some embodiments. In FIG. 2A, the blades 104 are driven (moved) toward the center of the wafer stack 101. In some embodiments, the blades 104 are moved toward the center of the wafer stack 101 about 3 mm to about 5 mm. As the blades 104 are driven toward the center of the wafer stack 101, air or liquid is sent through the channel 112 of the blades 104 at an area between the top wafer 102 and the bottom wafer 106 to help the separation of the top wafer 102 and the bottom wafer 106.

In some embodiments, the flow rate of air/liquid can be changed with the progress of the separation as shown in FIG. 1F. In some embodiments, the air/liquid flow 114 can have a flow rate up to 1 c.c. per minute or more. In some embodiments, the blade 104 can inject or send out deionized (DI) water through the channel 112. The temperature of the air or liquid can be at a room temperature. In some embodiments, the temperature of air or liquid is about 22° C.-23° C.

As the top wafer 102 and the bottom wafer 106 are separated, the bottom stage 108 is moved downward to help the separation in some embodiments. Also, the top stage 110 is moved upward to help the separation in some embodiments. The bottom stage 108 may be moved downward simultaneously as the blades 104 are inserted to separate the wafers 102 and 106 in some embodiments. The vacuum suction of the top stage 110 and the bottom stage 108 may range from −800 mbar to −1600 mbar in some embodiments. In other embodiments, vacuum pressure range of the top stage 110 and the bottom stage 108 can be different.

The blade 104 provides a separation force between wafers 102 and 106 during insertion and while moving toward the center of the wafer stack 101. The air/liquid flow 114 from the channel 112 assists the separation in some embodiments. The air/liquid flow 114 helps to separate the bonded interface of the top wafer 102 and the bottom wafer 106 with less damage. The method using the blade 104 that has the channel 112 capable of injecting air/liquid to assist the debonding process reduces damages to wafers, thus helps to make the bonding-debonding process to be a re-workable process.

FIGS. 2C-2E are top views of the debonding scheme according to some other embodiments. In FIG. 2C, one blade 104 is shown and the blade 104 is inserted between wafers 102 and 106 from one location. In FIG. 2D, two blades 104 are shown and the blades 104 are inserted between wafers 102 and 106 from two locations, e.g., 180 degrees apart. In FIG. 2E, three blades 104 are shown and the blades 104 are inserted between wafers 102 and 106 from three locations, e.g., 120 degrees apart. Any other number of blades 104 is possible in some embodiments.

Figure 3:
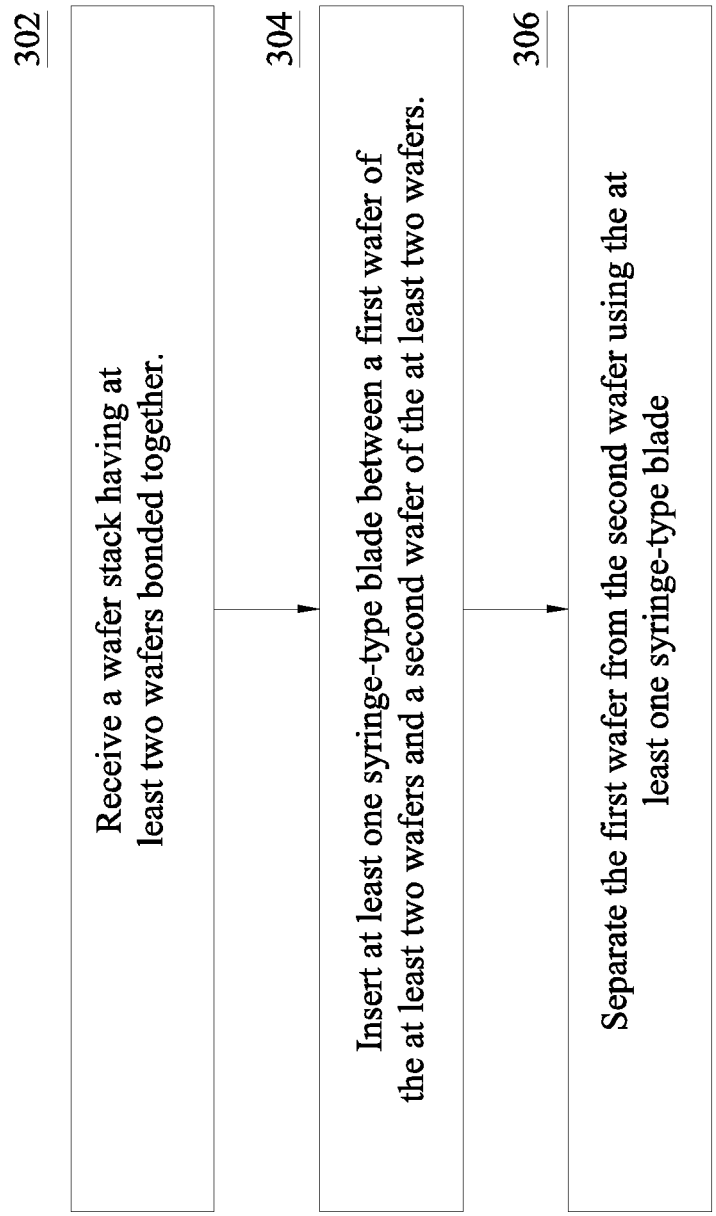
FIG. 3 is a flow diagram illustrating the method of the debonding scheme of the wafer stack in FIGS. 1A-1B, and 2A-2E according to some embodiments.

FIG. 3 is a flow diagram illustrating the method of the debonding scheme of the wafer stack in FIGS. 1A-1B, and 2A-2E according to some embodiments. At operation 302, a wafer stack 101 having at least two wafers bonded together (such as 102 and 106) is received. The wafer stack 101 is mounted and fixed on the bottom stage 108. The wafer stack 101 is also held and fixed under the top stage 110 by vacuum suction in some embodiments.

At operation 304, at least one blade 104 is inserted between a first wafer (e.g., the top wafer 102) and a second wafer (e.g., the bottom wafer 106). An inserting force is applied to the blade 104 to provide debonding energy ranging from 0.3 J/m²-50 J/m² at the bonded interface in some embodiments. The debonding process is assisted by an air/liquid flow 114 from the channel 112 of the blade 104.

At operation 306, the first wafer 102 is separated from the second wafer 106 using the at least one blade 104. The blade 104 is moved toward the center of the wafer stack 101 for the separation of the first wafer 102 and the second wafer 106. The bottom stage 108 holding the bottom wafer 106 by vacuum suction is moved downwards to help the separation in some embodiments. The top stage 110 holding the top wafer 102 by vacuum suction is moved upwards to help the separation in some embodiments. The debonding process is assisted by an air/liquid flow 114 from the channel 112 of the blade 104.

For moving the top stage 110 and/or the bottom stage 108, a servo motor driving a ball screw can provide a linear downward movement to the top stage 110 and/or the bottom stage 108 in some embodiments. Some servo motor provides debonding energy ranging from 0.3 J/m²-50 J/m² in some embodiments. The downward movement can be applied continuously to complete the debonding process in some embodiments. The impedance of the servo motor can be measured to calculate the debonding force to help debonding mechanism analysis in some embodiments. The whole debonding process is performed in a vacuum chamber with a pressure ranging from about 0.01 mbar to about 955 mbar ambient in order to avoid particle issue and also avoid the force concentration from deformation of bonded wafers 102 and 106 at the starting point of the debonding process in some embodiments. Otherwise, the force concentration may damage the wafers 102 and 106 in some cases.

FIGS. 4A-4D are side views of intermediate stages of another debonding scheme of the wafer stack according to some embodiments. For the debonding process, a wafer stack 101 having at least two wafers bonded together is received. The bonded wafer stack 101 is mounted and fixed on a bottom stage 401. A detacher 400 is used to debond the wafer stack 101 including a top wafer 102 and a bottom wafer 106 as described below.

Figure 4A:
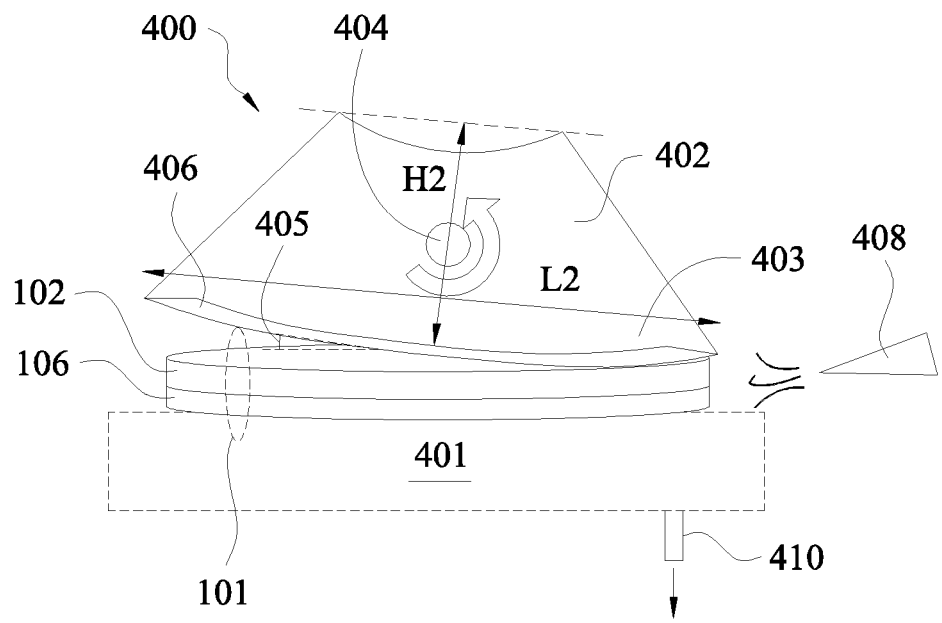
FIGS. 4A-4D are side views of intermediate stages of another debonding scheme of the wafer stack according to some embodiments.

In FIG. 4A, the wafer stack 101 is mounted on a bottom stage 401. The bottom stage 401 is a vacuum stage providing vacuum suction (with the vacuum module 410) on the bottom surface of the bottom wafer 106 to help stabilize and hold the bottom wafer 106 of the wafer stack 101 during the debonding process in some embodiments.

The bottom stage 401 has a diameter (or a surface length) ranging from 310 mm to 350 mm in some embodiments to handle various wafer sizes. The bottom stage 401 may be made of SiN, stainless steel, aluminum, any combination thereof, or any other suitable material. The vacuum suction of the bottom stage 401 may range from about −800 mbar to about −1600 mbar in some embodiments. In other embodiments, the size, material, and vacuum pressure range of the bottom stage 401 can be different.

The detacher 400 has a body 402 and a rotation axis 404. The body has a convex bottom surface 403. For example, the convex bottom surface 403 can be a roller shape surface. The body 402 has a bottom diameter or length L2 ranging from about 250 mm to about 450 mm, and a height H2 ranging from about 100 mm to about 300 mm in some embodiments. The length L2 can be smaller or larger than the diameter of the wafer stack 101. In one example, the body 402 has a bottom diameter or length of about 350 mm and a height of about 175 mm. The body 402 is made of aluminum, stainless steel, or any other suitable material. In some embodiments, the convex bottom surface 403 has a roller shape and can be rotated in a roller like motion.

A rotation axis 404 is connected to the body 402. The rotation axis 404 is configured to rotate the convex bottom surface 403. In some embodiments, the rotation axis 404 rotates the body 402 at a speed ranging from about 0.1 degree/sec to about 0.2 degree/sec. The rotation axis 404 has a diameter ranging from 10 mm to 50 mm in some embodiments. The rotation axis 404 is made of aluminum, stainless steel, or any other suitable material. The rotation axis 404 has a diameter of about 25 mm in one example. FIG. 4E is a top view of the detacher in FIGS. 4A-4D according to some embodiments. The body 402 with the length L2 and the rotation axis 404 are shown.

An attachment element 406 is configured to attach the convex bottom surface 403 of the body 402 to a top surface of a wafer stack 101. The attachment element 406 is a vacuum suction module in some embodiments. In other embodiments, the attachment element 406 can be a glue layer. The glue layer has a strength range greater than 30 MPa in some embodiments. The glue layer as the attachment element 406 has a thickness up to 3 mm or more in some embodiments. The glue layer is made of a tape layer, UV-curable adhesive layer, acrylic resin, or any other suitable material. In some embodiments, the glue layer may have a cure temperature less than 100° C. If the glue layer has a cure temperature higher than 100° C., the bonding interface strength becomes higher relatively quickly, which can make the debonding process more difficult.

A contact angle 405 between the top surface of the wafer stack 101 and the convex bottom surface 403 (or the attachment element 406) is in the range of 1°-10° in some embodiments. The smaller the contact angle 405 is, the more gradual debonding force can be obtained, which helps to separate the wafers 102 and 106 gently. On the other hand, the greater the contact angle 405 is, the higher debonding speed can be obtained. Thus, balancing the gradual debonding force to not cause damage on the wafers and the debonding speed can be considered to find the optimal contact angle 405 range.

An air gun 408 is used to blow air at an area between the top wafer 102 and the bottom wafer 106 of the wafer stack 101 to assist the debonding process in some embodiments. The air gun 408 does not contact the wafers 102 and 106, and it can be any kind of air flow equipment used in a clean room environment. The air gun 408 is made of metal or plastic in some embodiments. The temperature of air from the air gun 408 is about 22° C.-23° C. in some embodiments.

In FIG. 4A, the detacher 400 makes contact with the top surface of the wafer stack 101 and downward force is applied to help attach the detacher 400 to the top wafer 102 of the wafer stack 101. The air gun 408 can be used to blow air between the top wafer 102 and the bottom wafer 106 of the wafer stack 101 in some embodiments. The contact area between the attachment element 406 and the top wafer 102 of the wafer stack 101 is increased as the detacher 400 is rotated. The rotation axis 404 is used to rotate the detacher 400 and positioned to be parallel to the top surface of the wafer stack 101. In some embodiments, the rotation axis 404 rotates the body 402 of the detacher 400 at a speed ranging from about 0.1 degree/sec to about 0.2 degree/sec.

Figure 4B:
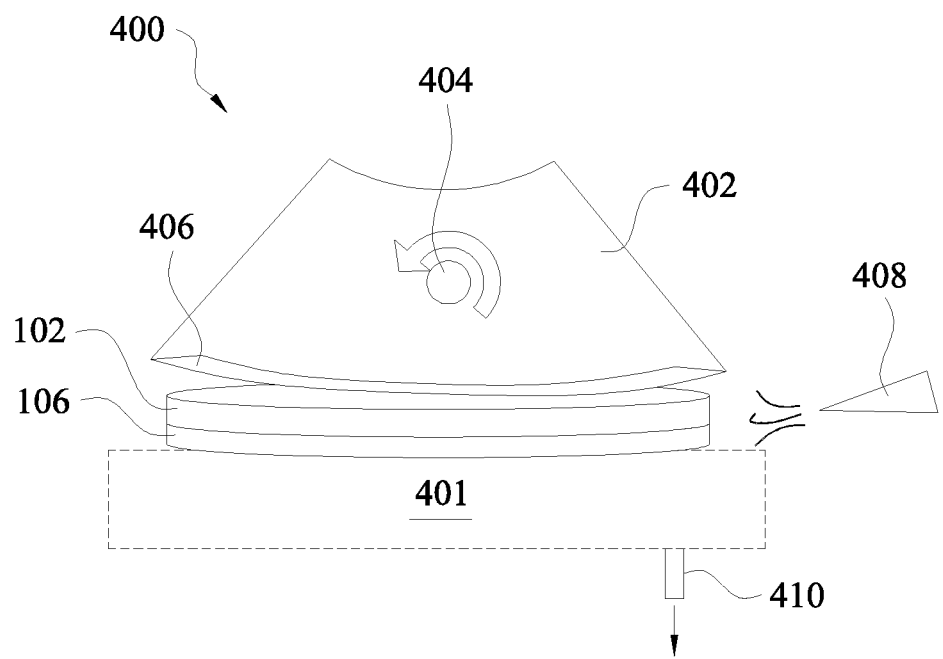

In FIG. 4B, the attachment element 406 of the detacher 400 is attached to the top surface of the wafer stack 101 firmly. As the detacher 400 is rotated around the rotation axis 404, the contact area of the detacher 400 to the wafer stack 101 increases, and the debonding force to separate wafers 102 and 106 also increases. The rotational motion of the detacher 400 causes it to apply an upward force on the wafer stack 101. In the illustrated embodiment, detacher 400 rotates in a counter-clockwise direction, which rotates the convex bottom surface 403 to press against the wafer stack 101 on the left side of the illustrated embodiment, while pulling away from the wafer stack on the right side of the illustrated embodiment, thus causing the debonding force to separate the wafers. With the rotation of the detacher 400, the corner of the top wafer 102 attached to the detacher 400 and the bottom wafer 106 held by the bottom stage 401 begin to be separated. The air gun 408 can be used to blow air between the top wafer 102 and the bottom wafer 106 to assist breaking the bonding in some embodiments.

Figure 4C:
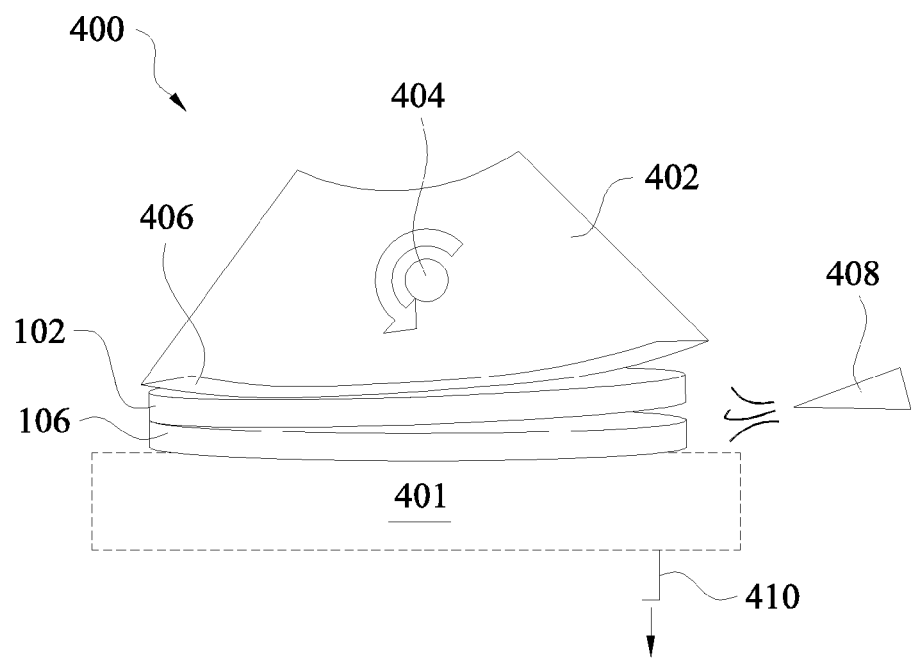

In FIG. 4C, as the detacher 400 is rotated further around the rotation axis 404, the break between the top wafer 102 and the bottom wafer 106 increases to further separate the wafers 102 and 106. The air volume of the air gun 408 can be increased to assist breaking the bonding between the top wafer 102 and the bottom wafer 106, thus facilitating the separation of the wafers 102 and 106 in some embodiments.

Figure 4D:
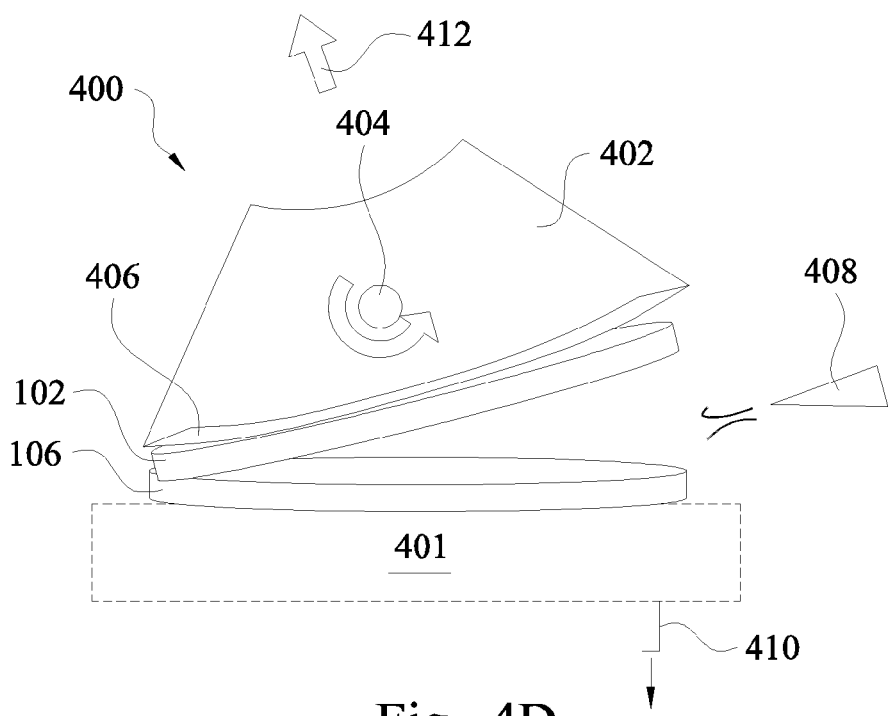
Figure 4E:
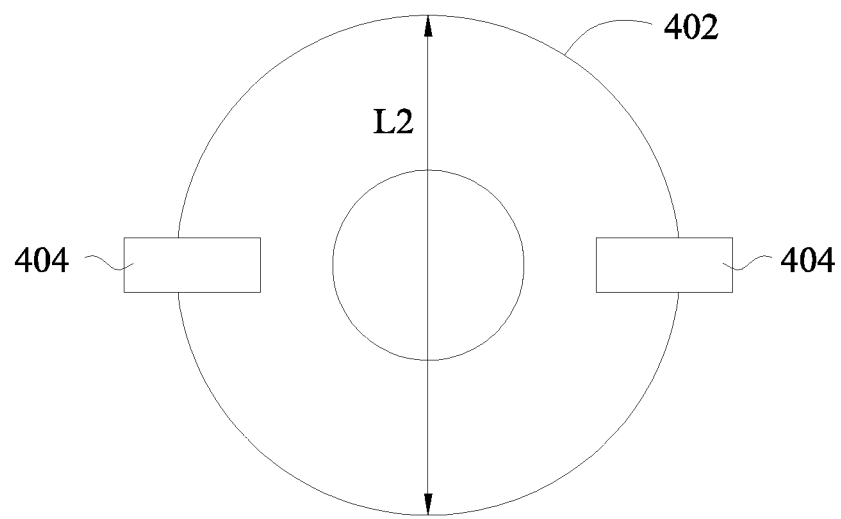
FIG. 4E is a top view of the detacher in FIGS. 4A-4D according to some embodiments.

In FIG. 4D, the detacher 400 is further rotated around the rotation axis 404, and completely separate the top wafer 102 from the bottom wafer 106. In some embodiments, the detacher 400 and the rotation axis 404 can be lifted upward (indicated by an arrow 412) as the top wafer 402 is separated from the bottom wafer 406. In some embodiments, the bottom stage 401 holding the bottom wafer 106 can be moved downward during a debonding process to help the separation of the top wafer 102 from the bottom wafer 106. After the separation is complete, the air gun 408 stops blowing air in some embodiments.

Figure 4F:
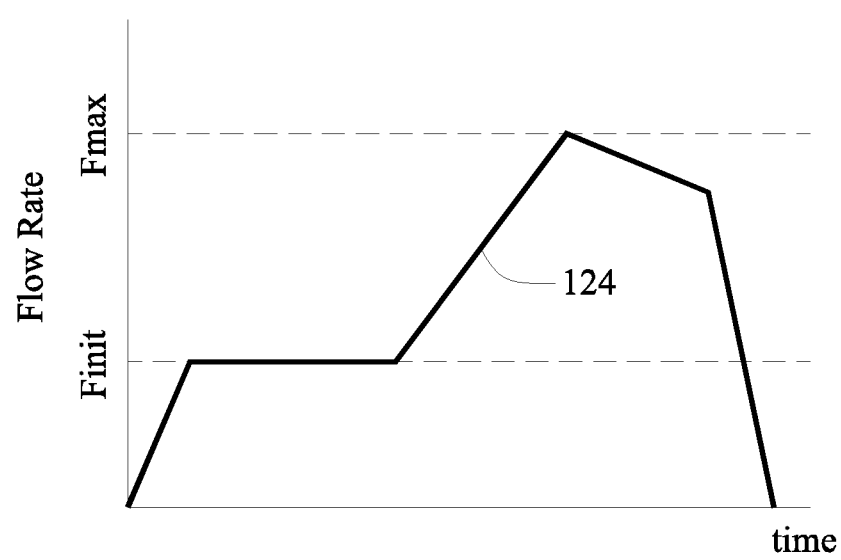
FIG. 4F is a plot of air flow rate vs. time from the air gun in FIGS. 4A-4D according to some embodiments.

In some embodiments, the air flow from the air gun 408 is adjusted throughout the debonding process in FIGS. 4A-4D. FIG. 4F is a plot of air flow rate vs. time from the air gun in FIGS. 4A-4D according to some embodiments. For example, the air gun 408 starts blowing air in FIG. 4A with an initial flow rate Finit, then increases the air flow as the detacher 400 rotates in FIGS. 4B and 4C to assist breaking the bonding between the top wafer 102 and the bottom wafer 106. The air gun 408 can reach a maximum air flow Fmax as the wafers 102 and 106 are separated. After the separation of the top wafer 102 and the bottom wafer 106 in FIG. 4D, the air gun 408 stops the air flow in some embodiments.

In some embodiments, the detacher 400 is moved up or down to facilitate attaching the detacher 400 to the wafer stack 101 and separating the top wafer 102 and the bottom wafer 106. In some embodiments, a servo motor is used to rotate the rotation axis 404 and the body 402 of the detacher 400. The servo motor can provide the debonding energy ranging from 0.3 $J/m^2$ to 50 $J/m^2$ in some embodiments. The whole debonding process is performed in a high vacuum chamber with a pressure ranging from about 0.01 mbar to about 955 mbar ambient in order to avoid the force concentration that can damage the wafers 102 and 106 in some embodiments.

In some embodiments, a mechanical robot hand (not shown) can be used to separate the detacher 400 from the top wafer 102 when a glue layer was used as the attachment element 406. The robot hand holds the top wafer 102 with a pressure ranging from about −200 mbar to about −500 mbar in some embodiments. Any suitable robot hand available in the industry can be used. For example, the robot hand can be made of stainless steel or aluminum. The bottom stage 401 using vacuum suction can hold the bottom wafer 106 with an applied pressure ranging from about −800 mbar to about −1600 mbar in some embodiments.

The rotary and rolling movement of the detacher 400 for debonding the wafer stack 101 helps to reduce damage to the wafer stack 101, due to the gradual contacting trajectory of the bottom surface 403 to the wafer stack 101 in some embodiments. Compared to other debonding methods, using the detacher 400 helps to reuse the debonded wafers from the wafer stack 101 by reducing the bonded wafer stack 101 damage during the debonding process, which saves costs. The air flow from the air gun 408 also helps to create the breaking point of debonding in some embodiments. The method using the detacher 400 reduces damages to wafers, thus the bonding-debonding process becomes more of a re-workable process.

Figure 5:
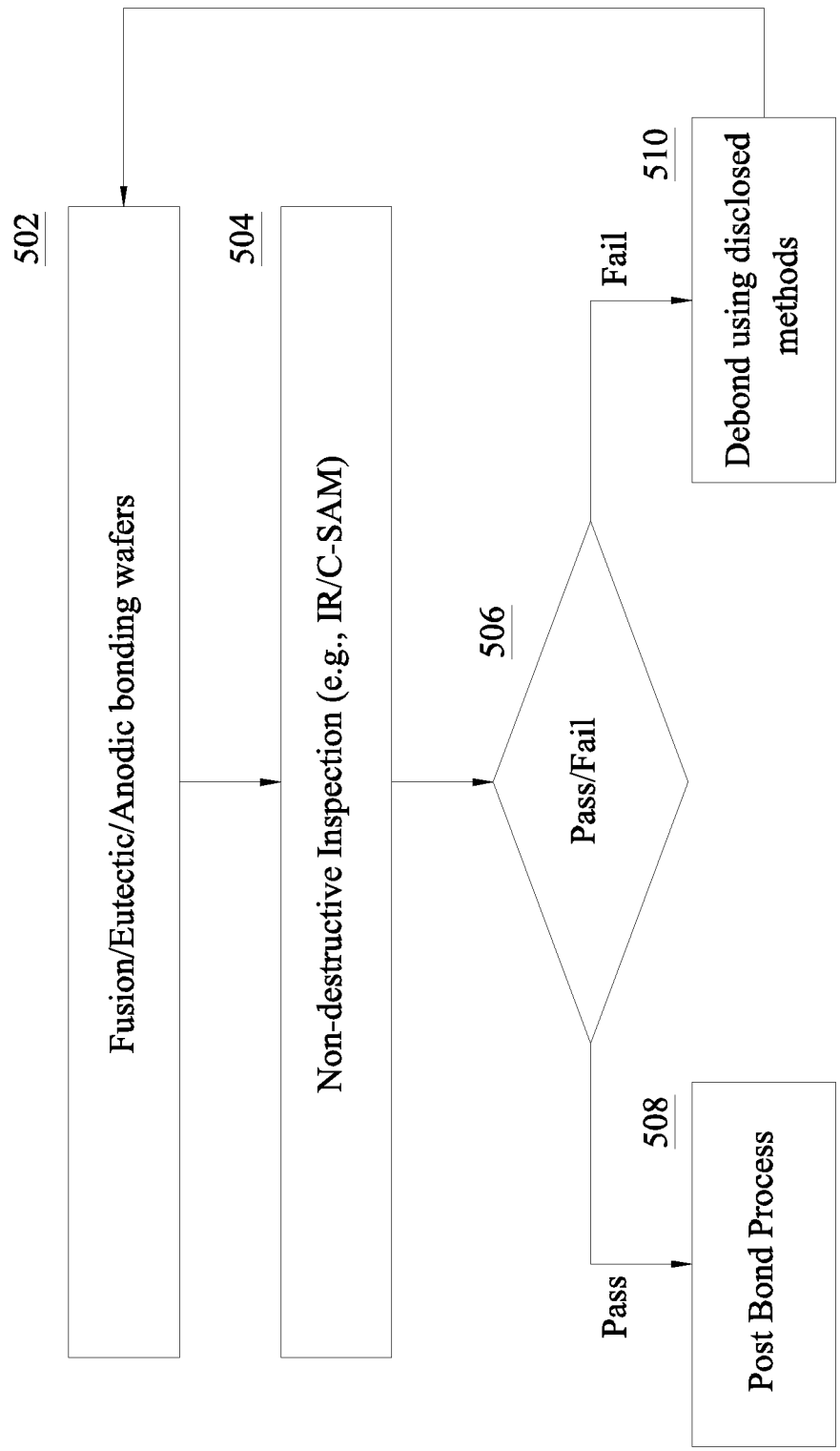
FIG. 5 is a flow diagram illustrating the method of the debonding scheme according to some embodiments.

FIG. 5 is a flow diagram illustrating the method of the debonding scheme according to some embodiments.

At operation 502, at least two wafers such as 102 and 106 are bonded together to form a wafer stack 101 using any suitable method. For example, fusion bonding, eutectic bonding, anodic bonding described above can be used in some embodiments.

At operation 504, a non-destructive inspection method is used to inspect the bonded surface of the wafer stack 101. For example, an infrared (IR) or C-mode scanning acoustic microscope (C-SAM) can be used for the inspection of the bonded surface of the wafer stack 101. The non-destructive inspection monitors whether the bonding is defective and/or the bonding alignment is correct.

At operation 506, whether the bonded surface of the wafer stack 101 passes or fails the inspection is decided, e.g., based on the bonding quality and/or misalignment. If the wafer stack 101 passes the inspection, a post bond process can begin at operation 508, such as finishing the product. If the wafer stack 101 fails the inspection, debonding using the disclosed methods herein is performed at operation 510. After the debonding process is complete, the wafers 102 and 106 are cleaned to remove any impurities or contaminants before re-bonding in some embodiments. Then the wafers 102 and 106 go back to operation 502 for another bonding process and repeat the operations until the bonded wafer stack 101 passes the inspection. By using the debonding methods disclosed herein, wafer damage during the debonding process is reduced. Thus, more wafers can be reused for rebonding, and the fabrication cost is saved.

For cleaning the wafers 102 and 106 before re-bonding, a plasma cleaning process can be used in some embodiments. Plasma cleaning involves the removal of impurities and contaminants from surfaces through the use of an energetic plasma or dielectric barrier discharge (DBD) plasma created from gaseous species. Gases such as argon and oxygen, as well as mixtures such as air and hydrogen/nitrogen are used in some embodiments. The plasma is created by using high frequency voltages ranging from 1 kHz to over 1 MHz to ionize the gas in low pressure (typically around 1/1000 atmospheric pressure) or in atmospheric pressure in some embodiments.

If a fusion bonding is used for bonding the wafer stack 101 at operation 502, the wait time (Q-time) should be maintained to be less than 1 hour between the bonding and debonding stations to help the debonding process in some embodiments. The fusion bonded wafer stack 101 should not be annealed after being determined as a failure at operation 506 after the C-SAM or IR inspection at operation 504 to facilitate the debonding process.

Debonding schemes are disclosed herein. In one method, at least one blade is used to separate a wafer stack having at least two bonded wafers by inserting the blade between the wafers. Air or liquid is injected through the channel of the blade to assist the debonding process in some embodiments. In another method, a detacher having a convex bottom surface is attached to the top surface of the wafer stack and rotated to debond the wafers. An air gun is used to assist the separation of wafers in some embodiments.

According to some embodiments, a wafer stack having at least two wafers bonded together is received. At least one blade is inserted between a first wafer of the at least two wafers and a second wafer of the at least two wafers. The at least one blade has a channel configured to inject air or fluid. The first wafer is separated from the second wafer using the at least one blade.

According to some embodiments, an apparatus includes a bottom stage configured to hold a bottom surface of a wafer stack including at least two wafers. A top stage is configured to hold a top surface of the wafer stack. At least one blade is configured to be inserted between two adjacent wafers of the wafer stack. The at least one blade has a channel configured to inject air or fluid.

According to some embodiments, a method includes receiving a wafer stack having at least two wafers. The at least two wafers includes a first wafer and a second wafer bonded together. A detacher having a convex bottom surface is attached to the wafer stack. The convex bottom surface faces a top surface of the wafer stack. The first wafer is separated from the second wafer using the detacher.

According to some embodiments, an apparatus includes a body having a convex bottom surface. A rotation axis is connected to the body. The rotation axis is configured to rotate the convex bottom surface in a roller type motion. An attachment element is configured to attach the convex bottom surface of the body to a top surface of a wafer stack. The wafer stack includes at least two wafers bonded together.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a wafer stack having at least two wafers bonded together;
inserting at least one blade between a first wafer of the at least two wafers and a second wafer of the at least two wafers, wherein the at least one blade has a channel configured to inject air or fluid, wherein the at least one blade has a pointed tip in plan view; and separating the first wafer from the second wafer using the at least one blade.

2. The method of claim 1, wherein four blades are used, the four blades are arranged at four locations around a circumference of the wafer stack, and the four locations are separated from each other by an equal distance.

3. The method of claim 1, further comprising moving the at least one blade towards a center of the wafer stack.

4. The method of claim 1, further comprising sending air or liquid through a channel of the at least one blade at an area between the first wafer and the second wafer.

5. The method of claim 4, wherein the liquid comprises deionized water.

6. The method of claim 1, further comprising mounting the wafer stack on a bottom stage.

7. The method of claim 6, further comprising the bottom stage holding a bottom surface of the wafer stack using vacuum suction.

8. The method of claim 6, further comprising moving the bottom stage downward.

9. The method of claim 1, further comprising:
a top stage holding a top surface of the wafer stack; and
moving the top stage upward.

10. A method, comprising:
receiving a wafer stack having at least two wafers, wherein the at least two wafers includes a first wafer and a second wafer bonded together;
attaching a detacher having a convex bottom surface to the wafer stack, wherein the convex bottom surface faces toward a top surface of the wafer stack; and
separating the first wafer from the second wafer using the detacher.

11. The method of claim 10, further comprising rotating the detacher around an axis parallel to a top surface of the wafer stack.

12. The method of claim 10, further comprising blowing air at an area between the first wafer and the second wafer.

13. The method of claim 10, further comprising mounting the wafer stack on a stage.

14. The method of claim 13, further comprising the stage holding a bottom surface of the wafer stack using vacuum suction.

15. A method, comprising:
receiving a wafer stack comprising at least two wafers, the at least two wafers including a first wafer and a second wafer bonded together;
mounting the wafer stack on a bottom stage;
attaching a detacher to a top surface of the wafer stack, the detacher having a body and a rotation axis, the body having a convex bottom surface, at least a portion of the convex bottom surface contacting the top surface of the wafer stack;
rotating the detacher;
blowing air at an area between the first wafer and the second wafer; and
separating the first wafer from the second wafer using the detacher.

16. The method of claim 15, wherein the bottom stage comprises a vacuum stage, and wherein the method further comprises moving the bottom stage downward during the rotating the detacher.

17. The method of claim 15, wherein the rotation axis rotates the body of the detacher at a speed ranging from about 0.1 degree/sec to about 0.2 degree/sec.

18. The method of claim 15, wherein blowing the air comprises blowing the air at a variable air flow rate, the variable air flow rate comprising a first air flow rate and a second air flow rate, the second air flow rate being greater than the first air flow rate.

19. The method of claim 15, wherein a contact angle between the top surface of the wafer stack and the convex bottom surface is in a range of about 1°-10°.

20. The method of claim 15, further comprising moving the detacher upward and moving the bottom stage downward during a debonding process.

* * * * *